(12) United States Patent
Nicholson et al.

(10) Patent No.: US 6,507,272 B1
(45) Date of Patent: Jan. 14, 2003

(54) ENHANCED LINEARITY, LOW SWITCHING PERTURBATION RESISTOR STRING MATRICES

(75) Inventors: Richard Nicholson, Andover (GB); Simon Churchill, Whitchurch (GB); Hao Tang, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/915,464

(22) Filed: Jul. 26, 2001

(51) Int. Cl.$^7$ ................................................. H01L 1/01
(52) U.S. Cl. ........................ 338/320; 338/295; 338/319; 338/260; 341/154
(58) Field of Search .............................. 338/295, 235, 338/239, 203, 260, 319, 320; 341/154

(56) References Cited

U.S. PATENT DOCUMENTS

| | | | | |
|---|---|---|---|---|
| 1,381,579 A | * | 6/1921 | Minns .......................... | 338/320 |
| 4,228,418 A | * | 10/1980 | Piedmont et al. ............ | 338/195 |
| 5,379,190 A | * | 1/1995 | Hanamura et al. ........... | 338/320 |
| 5,396,245 A | | 3/1995 | Rempfer | |
| 5,504,471 A | * | 4/1996 | Lund ........................... | 338/320 |
| 5,568,146 A | | 10/1996 | Park | |
| 5,604,501 A | * | 2/1997 | McPartland .................. | 341/154 |
| 5,661,450 A | * | 8/1997 | Davidson ..................... | 338/320 |
| 5,703,588 A | | 12/1997 | Rivoir et al. | |
| 5,969,657 A | | 10/1999 | Dempsey et al. ............ | 338/320 |
| 6,008,719 A | * | 12/1999 | Jolivet ......................... | 338/320 |
| 6,127,957 A | * | 10/2000 | Fattaruso et al. ............ | 341/154 |
| 6,236,301 B1 | * | 5/2001 | Langford et al. ............ | 338/320 |
| 6,307,495 B1 | * | 10/2001 | Mahant-Shetti et al. .... | 341/154 |

FOREIGN PATENT DOCUMENTS

| | | | | |
|---|---|---|---|---|
| DE | 3526461 | * | 1/1987 | .................. 338/320 |
| GB | 2184893 | * | 7/1987 | .................. 338/307 |

* cited by examiner

Primary Examiner—Karl D. Easthom
(74) Attorney, Agent, or Firm—Blakely, Sokoloff, Taylor & Zafman LLP

(57) ABSTRACT

Enhanced linearity, low switching perturbation resistor string matrices. The resistor strings are arranged in an array of a plurality of rows of resistive elements and electrically arranged with rows equally spaced above and below the physical centerline of the array being coupled together in an opposite sense. Preferably also physically adjacent rows are equally spaced from the center of the electrical order of rows. This connection prevents accumulation of errors due to vertical and horizontal resistance gradients over the array. Also node selection by controlling node select transistors coupled to column select lines to select one node in each row, and also controlling row select transistors to select the row of the desired node minimizes settling time after a tap change by inducing equal and opposite voltage changes at points close together along the resistor string, whether in the array of the present invention or in the snake configuration.

40 Claims, 8 Drawing Sheets

ENHANCED LINEARITY, LOW SWITCHING PERTURBATION RESISTOR STRING MATRICES

BACKGROUND OF THE INVENTION

1. Field of the Invention

The present invention relates to integrated circuits of the type that use resistor strings for interpolation between two points of differing potential.

2. Prior Art

Many applications require linear interpolation between two points of differing potential where the interpolated point is programmable. The simplest way to implement this is to fix a string of resistive elements between two potentials, with switched taps at every node, as shown on FIG. 1. Each resistive element can be of any value, but for linear interpolation all elements must be nominally identical. Usually, and for the purposes of further discussion, the resistive element is an ohmic resistor.

When implementing such a structure on an integrated circuit, non-idealities in semiconductor processing lead to non-linearities in a nominally linear set of resistors. The measures of non-linearity to be considered are Differential Non-Linearity (DNL), defined as the deviation from the ideal voltage difference between tap n and tap n+1, and Integral Non-Linearity (INL), defined as the deviation of the voltage at tap n from an ideal voltage given by:

$$V_{IDEAL} = \left(\frac{V_H - V_L}{N}\right)n + V_L$$

where $V_H$ and $V_L$ are the higher and lower of the voltages to be interpolated between, N is the total number of taps and n is the tap under consideration ($1 \leq n \leq N$, numbering the taps from 1 to N).

The sources of INL and DNL in such an integrated system can be generalized as the random mismatch between two adjacent resistors due to process imperfections, contact resistance, mask tolerances, diffraction effects, etc., and the macro-scale (i.e., >>than the dimensions of an individual resistor) resistivity gradients across the structure.

The present invention concerns a novel way of arranging such a set of resistors so as to minimize INL and also a way of switching between voltage taps which least perturbs the voltages on the resistor chain. This is very important in low output glitch designs and also when more than one voltage tap is simultaneously selected from the same set of resistors.

BRIEF SUMMARY OF THE INVENTION

Enhanced linearity, low switching perturbation resistor string matrices. The resistor strings are arranged in an array of a plurality of rows of resistive elements and electrically arranged with rows equally spaced above and below the physical centerline of the array being coupled together in an opposite sense. Preferably also physically adjacent rows are equally spaced from the center of the electrical order of rows. This connection prevents accumulation of errors due to vertical and horizontal resistance gradients over the array. Also node selection by controlling node select transistors coupled to column select lines to select one node in each row, and also controlling row select transistors to select the row of the desired node minimizes settling time after a tap change by inducing equal and opposite voltage changes at points close together along the resistor string, whether in the array of the present invention or in the snake configuration.

DETAILED DESCRIPTION OF THE PREFERRED EMBODIMENT

Figure 1:
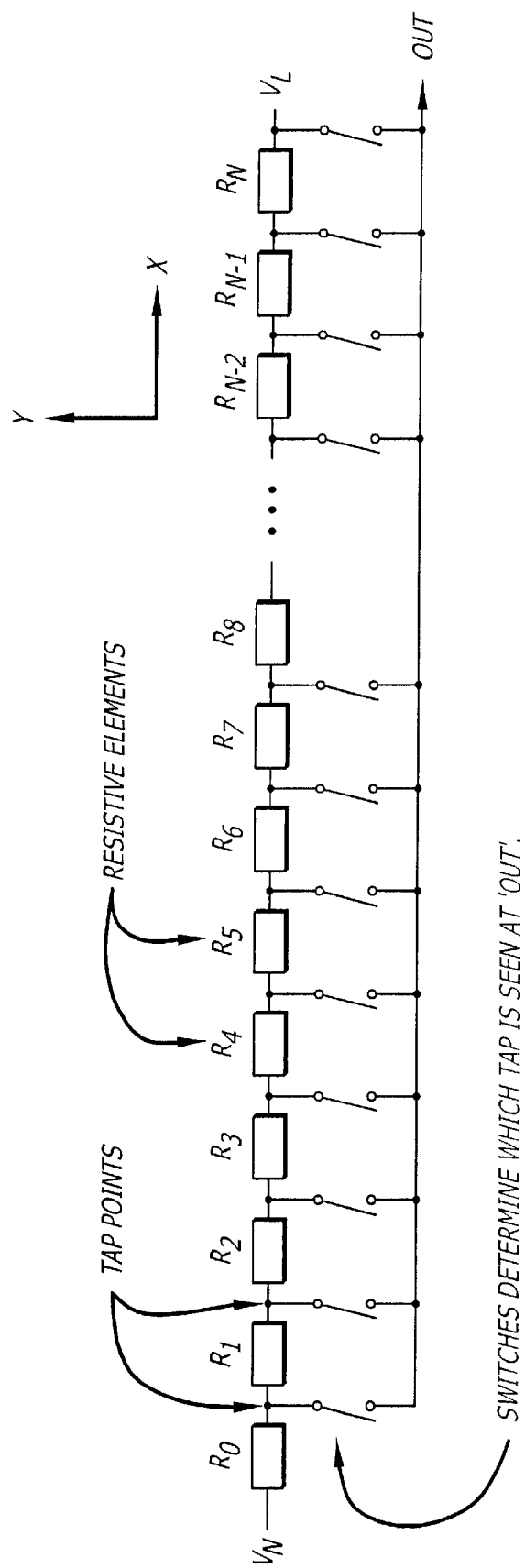
FIG. 1 illustrates a string of resistive elements coupled between two potentials, with switched taps at every node.
Figure 2:
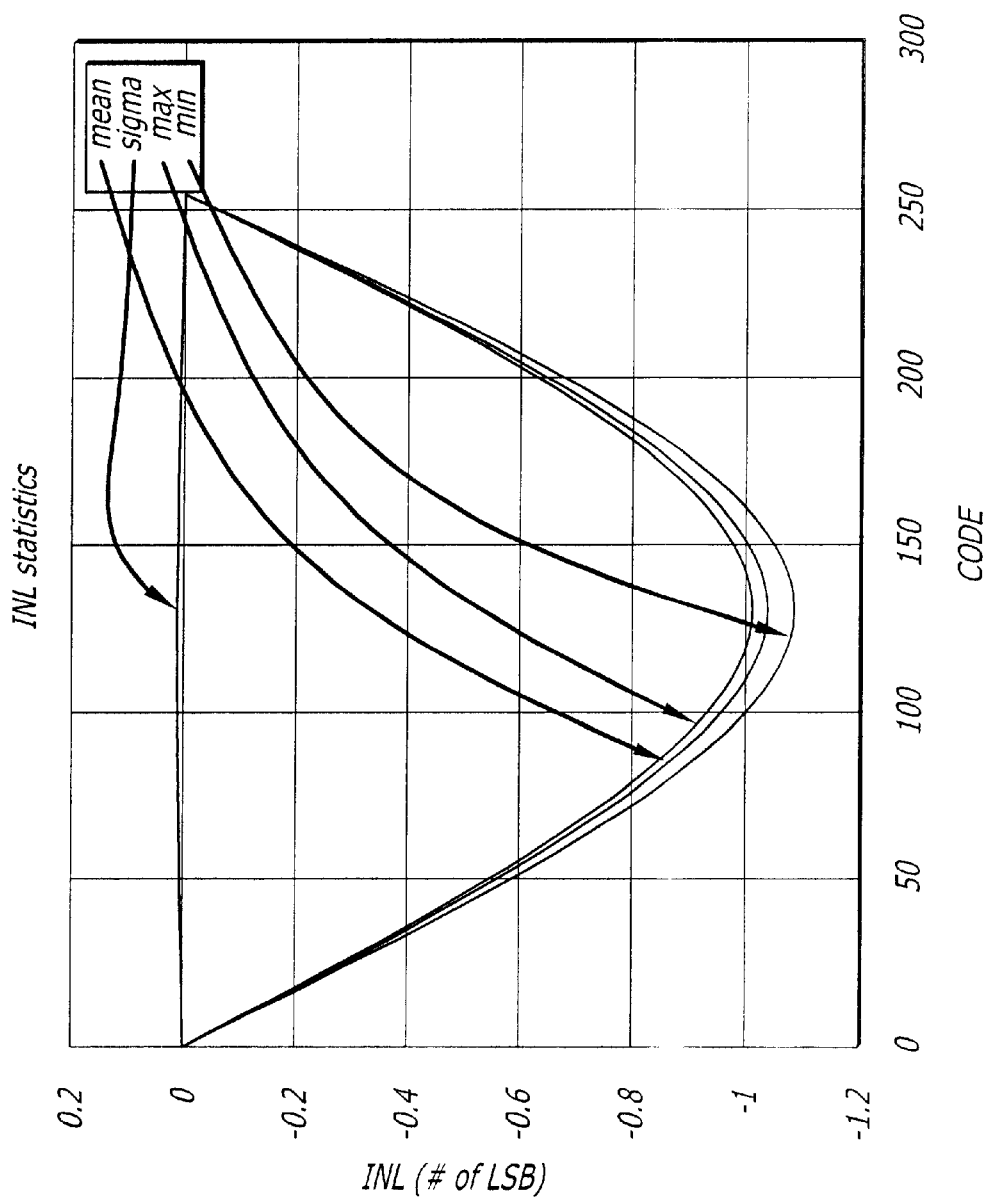
FIG. 2 is a graph illustrating the expected INL (Integral Non-Linearity) for the resistor string of FIG. 1 assuming 256 resistors and using nominal figures for the (first order) resistivity gradient in the X and Y directions, nominal figures for random resistor mismatch, and nominal resistor size.

FIG. 1 shows a diagrammatic representation of a linear resistor string linked between two potentials ($V_H$ and $V_L$) in a straight line. By taking nominal figures for the (first order) resistivity gradient in the X and Y directions, nominal figures for random resistor mismatch, and nominal resistor size and spacing, the expected INL can be calculated. Assuming 256 resistors, a plot of this is shown in FIG. 2 and will be used for comparison with the other approaches described herein. In this (and FIGS. 4 and 6), the "Min" and "Max" curves correspond to ±3 sigma from the mean curve.

Figure 3:
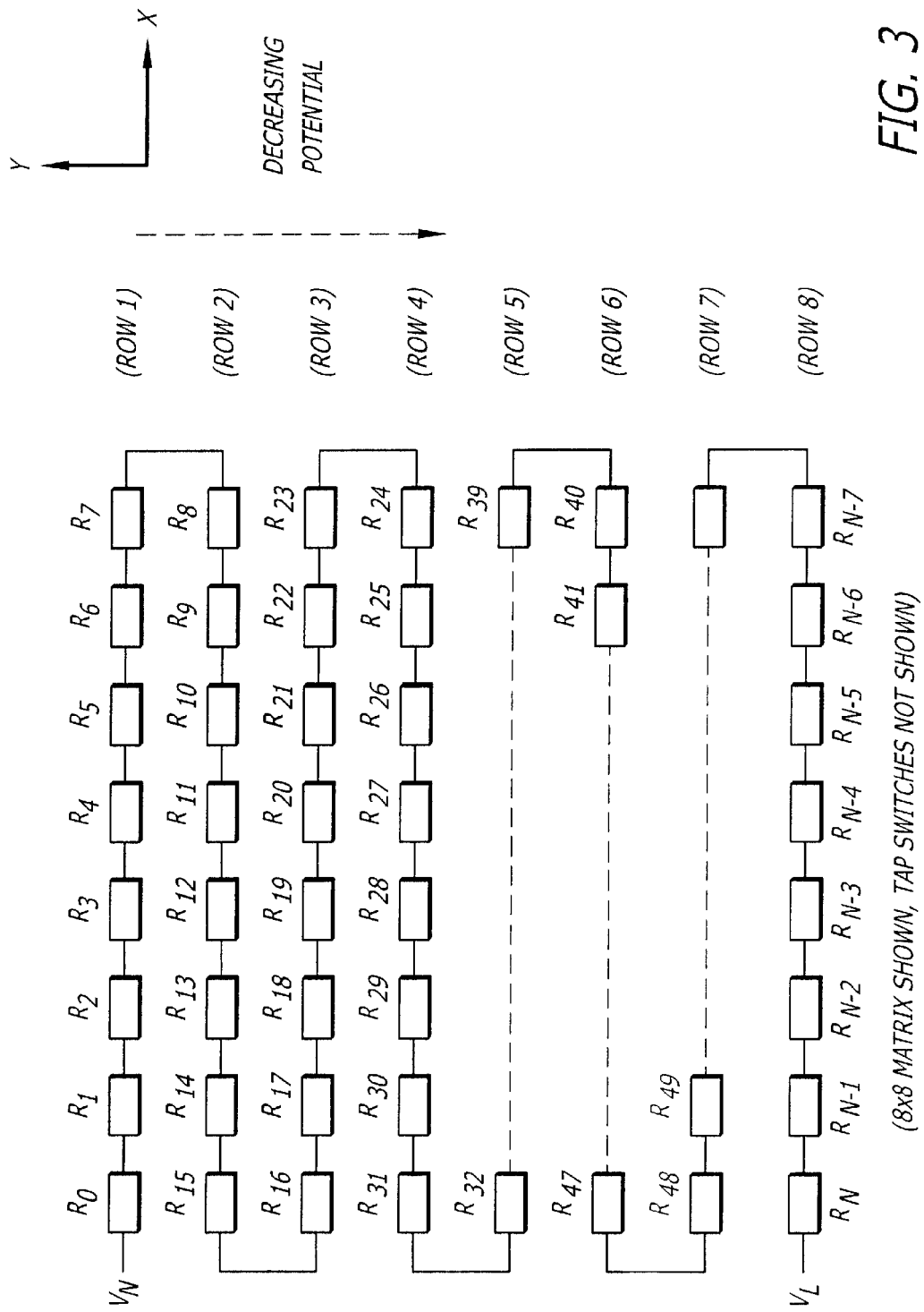
FIG. 3 illustrates a resistor chain folded two or more times, forming a so-called snake configuration.
Figure 4:
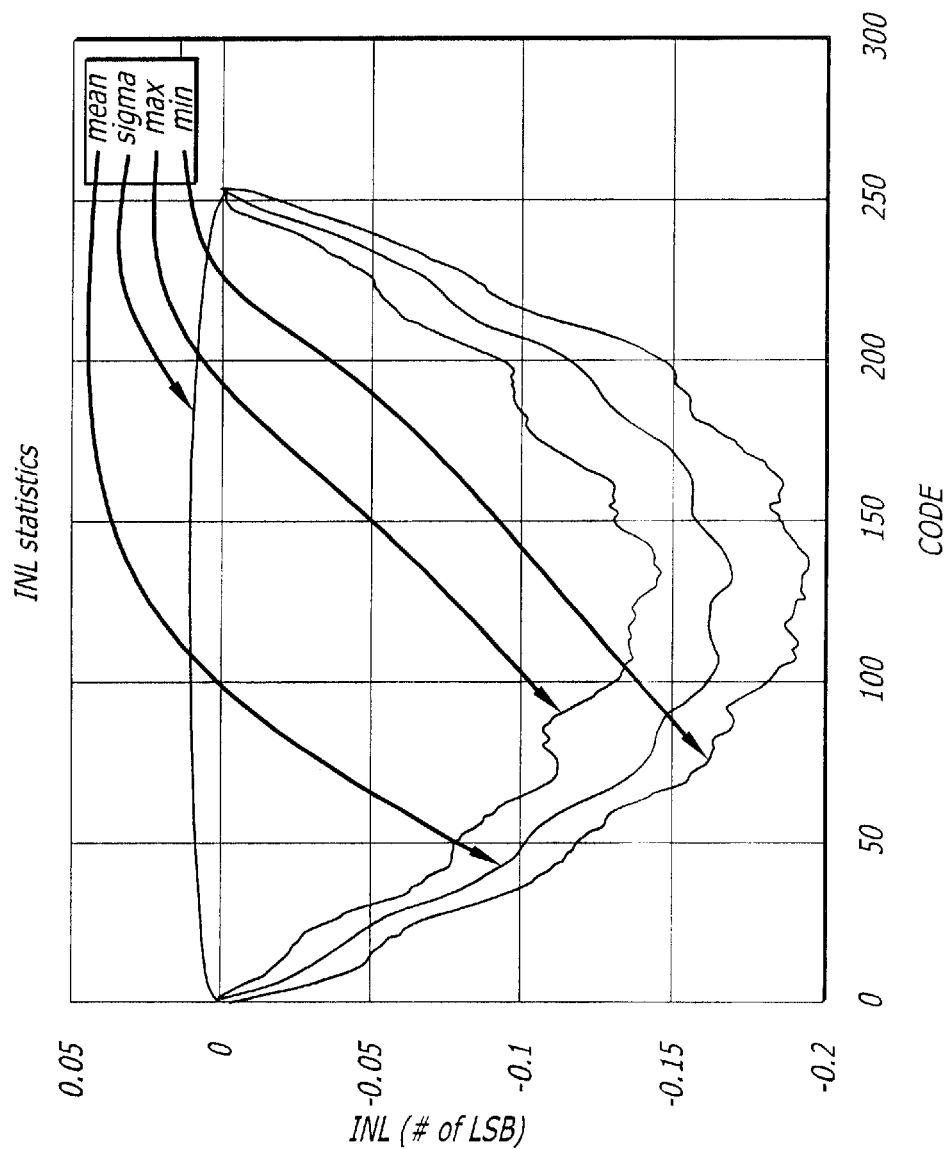
FIG. 4 is a graph illustrating the expected INL for the resistor string of FIG. 3 assuming the same number of resistors and the same nominal figures for the (first order) resistivity gradient in the X and Y directions, the same nominal figures for random resistor mismatch, and the same nominal resistor size as used for the graph of FIG. 2.

An improvement on this approach is to "fold" the resistor chain two or more times, forming the so-called "snake configuration" shown in FIG. 3. This approach reduces the effect of the X gradient while increasing the effect of the Y gradient. Using the same nominal figures for random mismatch, resistor size, resistor spacing and resistivity gradients as above, FIG. 4 shows the simulated INL for this approach. It can be seen that the worst case INL is around 5.5 times lower than for the straight string shown in FIG. 1. In addition, the more compact nature of the matrix allows for easier placement on a die, simpler tap selecting (decode) and routing of signals in and out of the matrix structure.

Figure 5:
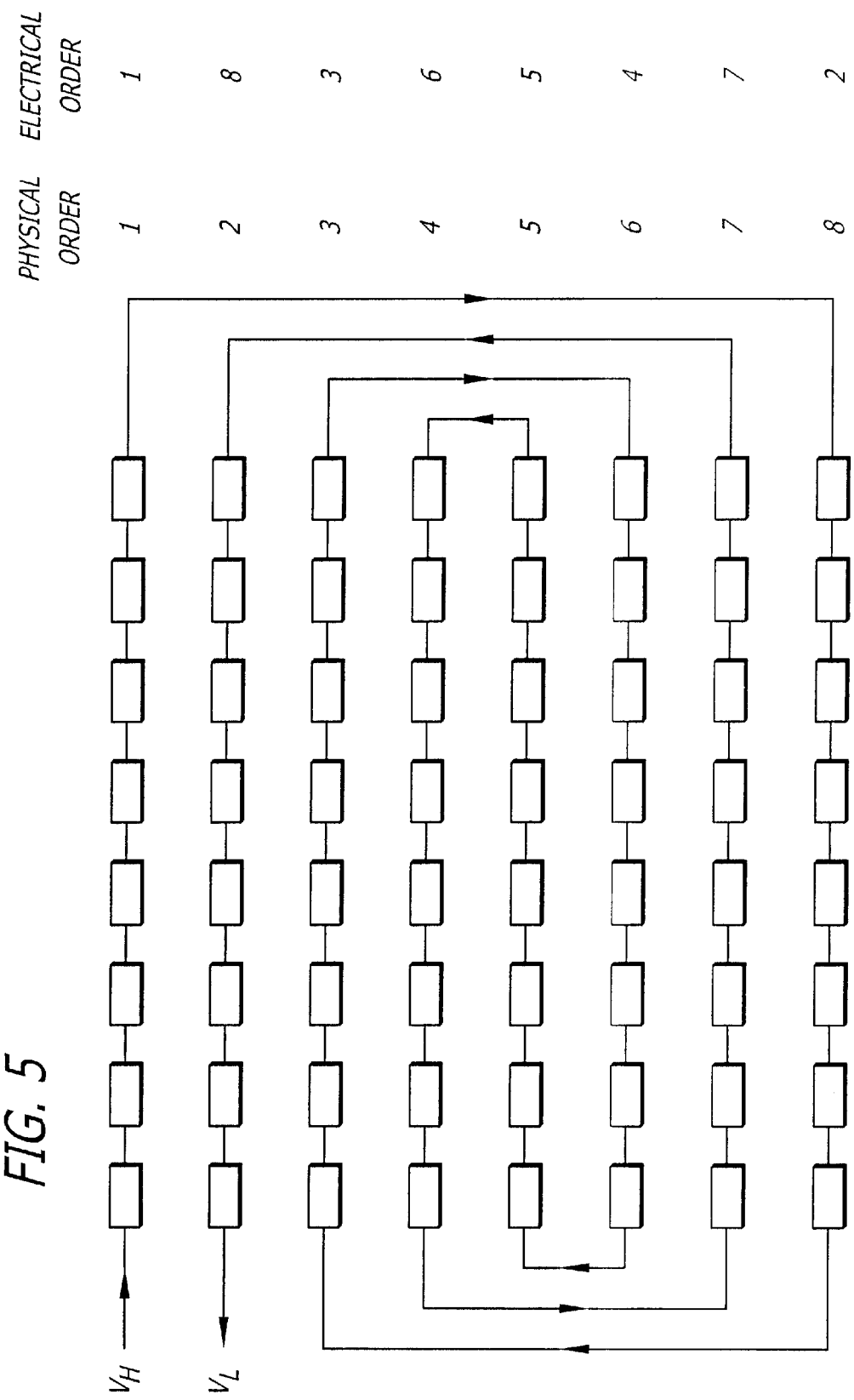
FIG. 5 illustrates one embodiment of the present invention resistor string.
Figure 6:
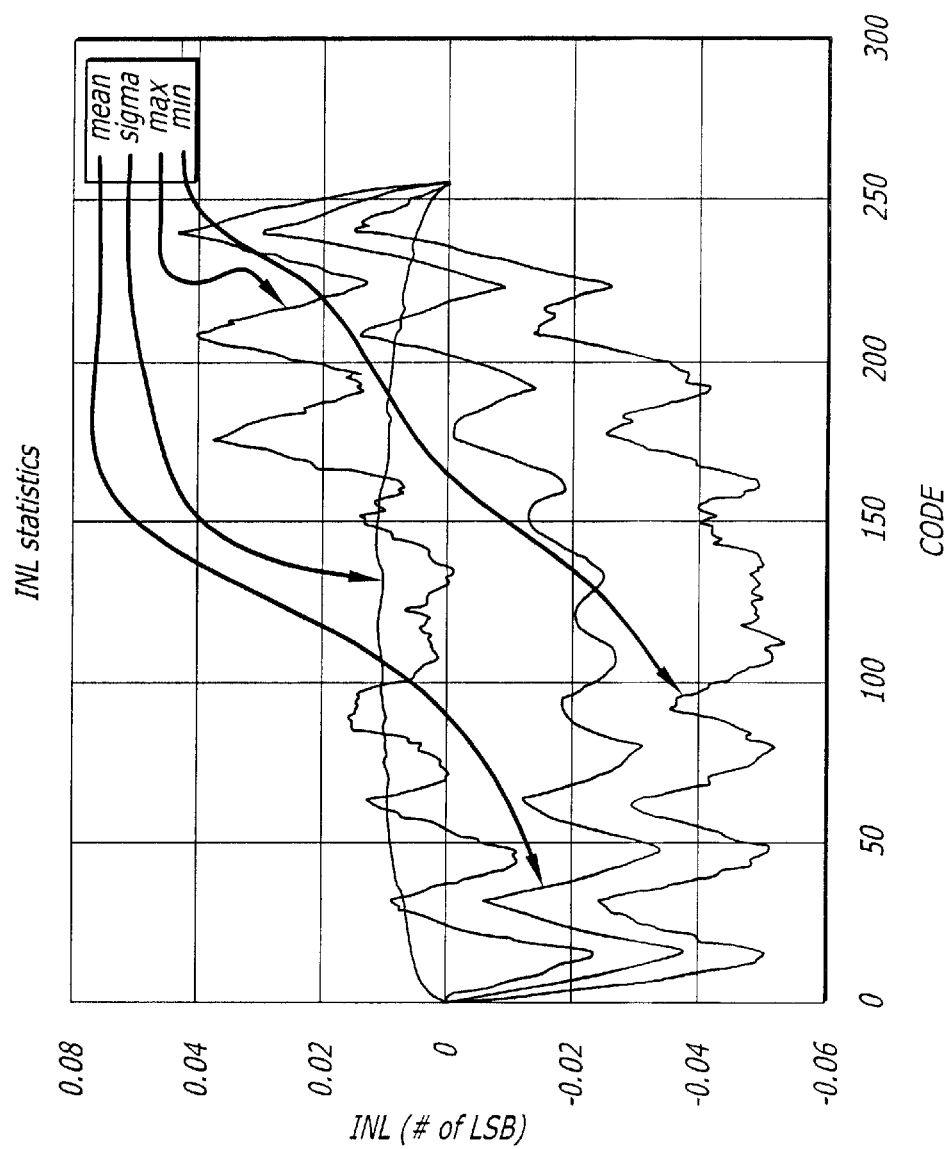
FIG. 6 is a curve illustrating the corresponding INL performance of the embodiment of FIG. 5.

One embodiment of the present invention is shown in FIG. 5, with the resulting INL performance shown in FIG. 6. The INL error at worst case is 3.5 times lower than that in the snake configuration.

The improvement is achieved by interleaving the rows of the snake configuration in the Y direction in an optimum manner to correct for first order sheet resistivity gradients. Thus in accordance with one aspect of the present invention, the N resistors in the resistor string are folded, not in a snake configuration as just described, but rather in a manner so that those equally spaced (physically) from the middle of the resistor string are electrically adjacent to each other. In another aspect of the invention, preferably physically adjacent rows of resistors are equally spaced from the center of the electrical order.

By way of example, one such configuration is illustrated in FIG. 5. As may be seen therein, the resulting resistor matrix is an 8×8 matrix, namely a matrix of eight rows of resistor string elements, each resistor string element being comprised of eight resistors. The physical middle of the matrix falls between rows 4 and 5. As to a vertical resistance gradient across the array of resistors, the average resistance of each resistor will be halfway between the resistance of the resistors in row 4 and the resistors in row 5. Assuming that the resistance gradient is such that the upper resistors are larger in value than the lower resistors, the resistors in the physical row 4 will be higher in value than the resistors in physical row 5. The effect of the higher valued resistors in physical row 4 will accumulate across the row, as will the effect of the lower valued resistors in row 5 accumulate across the row. However, the average value of each resistor in the series combination of rows 4 and 5 (16 resistors total) will equal the average resistor resistance for the entire array. The same argument may be made for physical rows 3 and 6, which are electrically connected in series in FIG. 5 and thus electrically adjacent rows. The same argument also applies to rows 2 and 7, and rows 1 and 8, all of which pairs of rows are electrically connected in series as shown in FIG. 5. It may also be seen from FIG. 5 that the resistors at positions equally spaced from the center of the electrical order (rows 1 and 2, 3 and 4, 5 and 6, 7 and 8) are physically adjacent rows of resistors. Finally, the specific order shown in FIG. 5 places rows equally spaced (physically) from the middle of the resistor string not only electrically adjacent each other, but in alternating pairs in terms of electrical ordering (moving down from the top of the array, row 1 and 2, then 8 and 7, then 3 and 4, and then 6 and 5). This last point, however, is a matter of choice.

As to a horizontal resistance gradient, the same resistance difference cancellation will occur for any two rows connected in series. Consequently, for any first order resistance gradient across the array, the pairs of electrically connected rows (1 and 8, 3 and 6, 4 and 5, and 2 and 7) will have the same average resistance per resistor as the entire array, so that the effect of the resistance gradient is not cumulative over the array, but rather any cumulative effects are confined to a pair of rows under consideration.

It may be seen from the foregoing that as to first order gradients, the order of the pairs or the order within each pair may be changed without affecting the result. By way of but one example, the electrical order 1,8,3,6,5,4,7,2 might just as well be 3,6,8,1,2,7,5,4. However, in the event for some reason there was a significant higher order gradient down the array, as opposed to a simple linear gradient, the ordering of the rows within each pair and/or the ordering of the pairs of rows within the array may be specifically selected to better reduce the effect of that higher order gradient also.

Thus, clearly a different interleave structure could be generated to correct for higher orders of gradient if these dominate in a target silicon process. This matrix benefits from the ease of external signal routing and decode inherent in the snake configuration matrix, at the expense of increased internal routing complexity. Nevertheless, in a modest 3-metal layer process, the matrix can be implemented within the same area as an equivalent snake configuration matrix, assuming routing in the higher metal layers is allowed over the resistive elements in the target silicon process.

Examining FIG. 6, it is seen that the minimum and maximum INL values are a strong function of random mismatch. Usually, random mismatch between resistors is a strong function of the resistor area, so the random component of INL could be reduced by using larger resistive elements. However, using larger resistive elements makes the whole array bigger, so the sheet resistivity gradient degrades the mean INL. Clearly, there is an optimum solution. As in reality, the "optimum" will also involve the required DNL, physical matrix size constraints, required element resistive value, matrix settling time and other complex interactions, this optimum can only be found on a case by case basis. As such, no attempt is made here to identify an optimum, although it is recognized that such an optimum can be found.

Normally the number of the lines of resistors in a digital to analog converter would be $2^N$, where N is a positive whole number. For the more general cases, there are four possibilities.

Case 1

If the total number of lines=2*N, where N is the even number, put N/2 pairs above the physical centerline and the N/2 pairs below the physical centerline symmetrically. For example, if N=6, total number of lines=12. One such possible pair would be (in Electrical order) 1,12,3,10,5,8 | 7,6,9,4,11,2, where | is the physical centerline. Another equivalent electrical order would be 12,1,3,10,5,8 | 7,6,9,4, 2,11.

Case 2

If the total number of lines=2*N, where N is an odd number, it is preferable to put the physical center pair (N and N+1) at the electrical centerline. For the rest of the pairs, (N−1)/2 pairs are placed above the physical centerline and (N−1)/2 pairs below the physical centerline. For example, assume N=5, so that the total number of lines =10. Thus physical rows 5 and 6 would be put in the center of the electrical order. One such possible pair would be (in electrical order) 1,10,8,3,[5|6],4,7,9,2, where | is the physical centerline, and [ ] is the electrical center pair. Another equivalent electrical order would be 10,1,3,8,[5|6],7,4,2,9. Notice the physical center pair [5,6] should always in the center of the electrical order.

Case 3

If the total number of lines=2*N+1, where N is an even number, it is preferable to put the physical center row in the center of the electrical order. The rest of the 2*N lines would follow case 1. For example, if N=6, the total number of lines=2*6+1=13. One such possible pairing would be (in electrical order) 1,13,3,11,5,9,{7},8,6,10,4,12,2, where physical row {7} is in the center of the electrical order. Another equivalent electrical order would be 13,1,3,11,5,9, {7},8,6,10,4,2,12. Notice the physical center row {7} should always in the center of the electrical order.

Case 4

If the total number of lines=2*N+1, where N is an odd number, it is preferable to put the physical center row in the center of the electrical order and the physical row on each side of the physical center row adjacent each side the electrical center row. The rest of the lines would follow case 2. For example, if N=5, the total number of lines 11. Thus physical row 6 is in the center of the electrical order, and physical rows 5 and 7 would be adjacent each side of row 6 in the electrical order. One such possible pair would be (in electrical order) 1,11,3,9,[5{6}7],8,4,10,2. Another equivalent electrical order would be 11,1,3,9,[7{6}5],8,4,2,10. Notice the electrical center is the physical center (row 6 in this case) and the adjacent physical pair (5 and 7 in this case)

should always in the center around the center row of the electrical order.

Figure 7:
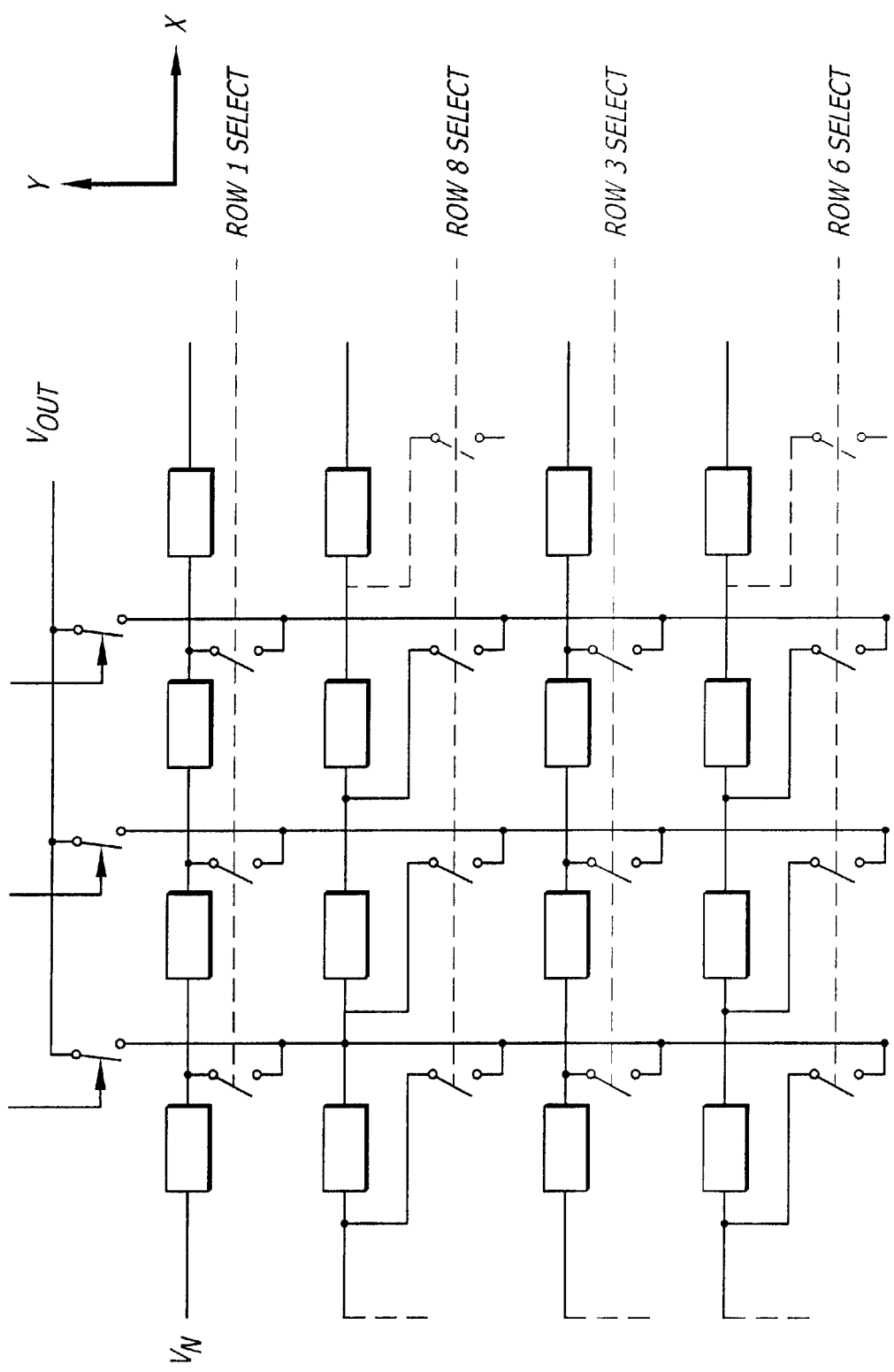
FIG. 7 illustrates a switching arrangement wherein an entire row is connected, each node to a respective column line, and the output is taken from a selected column line.

Another aspect of the present invention is the compact, low switching perturbation decode scheme. In a limited metal layer process (3 metal layers), it is not feasible to route every node of a large (>64 element) matrix out of that matrix. Therefore, signal selection must be made within the matrix. FIG. 7 illustrates one switching arrangement integrating a switch element along with each resistive element. In this arrangement, all resistor nodes in any row are connected, each to a respective column line, with one column being selected to select the voltage of the desired node for the output. In this arrangement, when a change to a new selected row is made, all nodes in the new row will have a different voltage than the prior selected row, and all columns must be driven to the respective new voltage before the output from the selected row settles. The overall effect of this is to "pull" the tap nodes of the resistor matrix to incorrect voltages momentarily, the voltage at each node recovering with a significant time constant.

This is seen as a momentary voltage glitch on the selected output tap. Often, this is not a severe problem, as at the system level there are usually other, larger sources of glitch during a tap change. However, in many applications, in order to minimize silicon area, the same set of interpolating resistive elements may have more than one active tap (e.g., a dual channel DAC with both channels using the same resistor string). In this case, when switching one tap, it is usually very important that the crosstalk into the other, unchanging tap is minimized.

Figure 8:
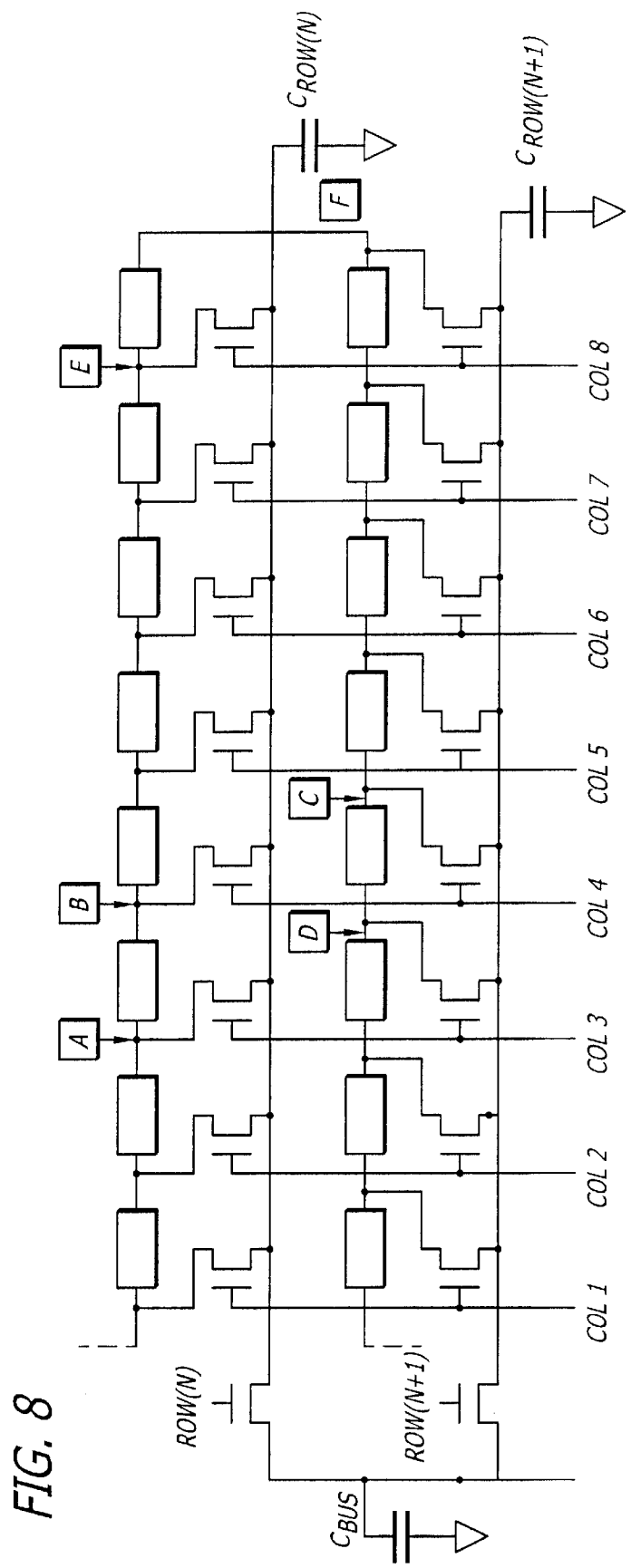
FIG. 8 illustrates two directly electrically connected (not necessarily physically adjacent) rows of a larger matrix, together with respective NMOS switches and the row/column decode lines of the present invention.

The present invention provides a way of arranging the switching scheme so that charge on the various parasitic capacitances of the array cancel during a tap change, resulting in very low matrix perturbation. Consider by way of example, FIG. 8. This Figure shows two directly electrically connected (not necessarily physically adjacent) rows of a larger matrix, together with NMOS switches and the row/column decode lines. The matrix may be any of the four cases discussed above. Note that this decode scheme will work equally well with a snake configuration matrix (in which case the two directly electrically connected rows will be physically adjacent rows in the matrix), or the new matrix shown in FIG. 5, in which case the two directly electrically connected rows may be substantially physically separated rows in the matrix. The only requirement is that the rows alternate in direction from start to end of the resistor chain. Also shown on the diagram on FIG. 8 are the parasitic capacitors $C_{ROW(n)}$, $C_{ROW(n+1)}$ and $C_{BUS}$.

Operation of the decoder is simple. For instance, to select tap point A using n-channel transistors, COL3 and the gate of the ROW(n) select transistor is taken to a high potential, and the gates of all other ROW select transistors and COL lines are left at a low potential. Similarly, to select tap point C, COL4 and the gate of ROW(n+1) select transistor are taken to a high potential, and the gates of all other ROW select transistors and COL lines are left at a low potential.

Now consider what happens to the charges on the parasitic capacitors $C_{ROW(n)}$, $C_{ROW(n+1)}$ and $C_{BUS}$ when switching from tap A to tap B. Initially, COL3 and the gate of the ROW(n) select transistor are at a high potential. $C_{BUS}$ and $C_{ROW(n)}$ are both charged to the potential at tap A, $C_{ROW(n+1)}$ is charged to the potential at tap D. To move to tap B, COL3 is dropped to a low potential and COL4 is taken to a high potential. Now, $C_{ROW(n)}$ and $C_{BUS}$ must be discharged by one resistive element voltage drop. $C_{ROW(n+1)}$ must be charged by one resistive element voltage drop.

Looking at this another way, $C_{ROW(n)}$ tries to pull tap B up by one element voltage drop, whereas $C_{ROW(n+1)}$ tries to pull tap C down by one element voltage drop. As the resistance between node B and node C is low, relative to the total matrix resistance, the charge difference on $C_{ROW(n)}$ and $C_{ROW(n+1)}$ cancel with very little perturbation of the matrix node voltages. In that regard, note that the above argument applies to any two electrically adjacent rows. Consequently, while in FIG. 8, the resistors on the left of the two array rows appear to be electrically separated by almost two row widths of resistors, they are each directly connected to the left-most resistor of the next electrically adjacent row (electrically adjacent rows n−1 and n+2), so that the settling time for any tap change is always very short. Also on a tap change, the perturbation within a row is also quite low, as the maximum voltage change that a row can undergo is V/N, where V is the voltage differential applied across the resistor string and N is the number of rows in the string.

As all the rows in the matrix are in left/right pairs (direction of positive potential gradient), this cancellation happens across the entire matrix during a column change. Also, the tap change can be greater that one resistive element, for instance moving from tap A to tap E will also cause cancellation between the charge difference on $C_{ROW(n)}$ and $C_{ROW(n+1)}$.

When considering a row change, e.g., from tap B to tap C, it can be seen that the potentials on $C_{ROW(n)}$ and $C_{ROW(n+1)}$ do not change. The potential on $C_{BUS}$ must change by the difference in the potential at tap B and the potential at tap C. This is seen as matrix settling time and does not effect other nodes in the matrix significantly as $C_{BUS}$ will be much smaller than the sum of $C_{ROW1}+C_{ROW2}+\ldots+C_{ROWN}$.

When changing both row and column, a combination of the above arguments is applicable and charges cancel as described for a change from tap A to tap B. Therefore, when moving from any tap in the matrix to any other tap in the matrix, the charges on parasitic capacitors cancel through a relatively low resistance path, resulting in very low overall perturbation and fast settling of the matrix node voltages.

While the invention has been described and illustrated in detail with respect to exemplary embodiments, it is to be understood that this disclosure is intended by way of illustration and example only and is not to be taken by way of limitation.

What is claimed is:

1. A resistor string comprising:
    a plurality of resistive elements connected in series on a substrate, the plurality of resistive elements being arranged in an array of columns and rows, the array having a physical middle defined by a plurality of rows above and an equal plurality of rows below the physical middle of the array, each pair of rows comprising a row above the physical middle of the array and the row equally spaced below the physical middle of the array being electrically connected together without another row of resistive elements being electrically connected there between to define an electrical order of rows.

2. The resistor string of claim 1 wherein the electrical order is also selected to place physically adjacent rows at positions equally spaced from the center of the electrical order of rows.

3. The resistor string of claim 2 wherein the total number of rows of resistors is 2*N, where N is an even number.

4. The resistor string of claim 2 wherein the total number of rows of resistors is 2*N, where N is an odd number, and wherein the physical center pair of rows is in the center of the electrical order of rows.

5. The resistor string of claim 2 wherein the total number of rows of resistors is 2*N+1, where N is an even number, and wherein the physical center row is in the center of the electrical order of rows.

6. The resistor string of claim 2 wherein the total number of rows of resistors is 2*N+1, where N is an odd number, and wherein the physical center row is in the center of the electrical order of rows.

7. The resistor string of claim 2 wherein the pairs of rows are connected together so that conduction across the array in one row of each of the pairs of rows is in the opposite direction from the conduction across the array in the other row of the respective pair of rows.

8. The resistor string of claim 7 further comprised of a plurality of node select transistors, each having a control terminal controlling the conduction through the respective node select transistor between first and second transistor terminals, each node select transistor having its first terminal coupled to a respective node along the string of resistive elements, the control terminal of the node select transistors in each column all being coupled to a respective column select line, and the second terminal of each node select transistor in each row of the array being coupled to a respective row line.

9. The resistive string of claim 8 further comprised of a row select transistor coupled to each row line.

10. The resistor string of claim 2 wherein the substrate is a silicon substrate.

11. The resistor string of claim 2 wherein the resistive elements are ohmic resistive elements.

12. A resistor string comprising:
a plurality of resistive elements connected in series on a substrate, the plurality of resistive elements being arranged in an array of columns and rows, the array having a physical middle defined by a plurality of rows above and an equal plurality of rows below the physical middle of the array, each pair of rows comprising a row above and a row equally spaced below the physical middle of the array being electrically connected together without another row of resistive elements being electrically connected there between, and connected so that conduction across the array in one row is in the opposite direction from the conduction across the array in the other row of each respective pair of rows; and,
a plurality of node select transistors, each having a control terminal controlling the conduction through the respective node select transistor between first and second transistor terminals, each node select transistor having its first terminal coupled to a respective node along the resistor string, the control terminal of the node select transistors in each column being coupled to a respective column select line, and the second terminal of each node select transistor in each row of the array being coupled to a respective row line.

13. The resistive string of claim 12 further comprised of a row select transistor coupled to each row line.

14. The resistor string of claim 12 wherein the substrate is a silicon substrate.

15. The resistor string of claim 12 wherein the resistive elements are ohmic resistive elements.

16. The resistor string of claim 12 wherein the electrical order is also selected to place physically adjacent rows at positions equally spaced from the center of the electrical order of rows.

17. The resistor string of claim 16 wherein the total number of rows of resistors is 2*N, where N is an even number.

18. The resistor string of claim 16 wherein the total number of rows of resistors is 2*N, where N is an odd number, and wherein the physical center pair of rows is in the center of the electrical order of rows.

19. The resistor string of claim 16 wherein the total number of rows of resistors is 2*N+1, where N is an even number, and wherein the physical center row is in the center of the electrical order of rows.

20. The resistor string of claim 16 wherein the total number of rows of resistors is 2*N+1, where N is an odd number, and wherein the physical center row is in the center of the electrical order of rows.

21. A method of reducing the effect of resistance gradients in an array of serially connected resistive elements on a substrate comprising:
arranging the plurality of resistive elements in an array of columns and rows, the array having a physical middle defined by a plurality of rows above and an equal plurality of rows below the physical middle of the array; and,
electrically connecting together each pair of rows comprising a row above the physical middle of the array and the row equally spaced below the physical middle of the array without electrically connecting another row of resistive elements there between.

22. The method of claim 21 further comprising selecting the electrical order to place adjacent physical rows at positions equally spaced from the center of the electrical order of rows.

23. The method of claim 22 wherein the total number of rows of resistors is 2*N, where N is an even number.

24. The method of claim 22 wherein the total number of rows of resistors is 2*N, where N is an odd number, and further comprising selecting the physical center pair of rows to be in the center of the electrical order of rows of resistive elements.

25. The method of claim 22 wherein the total number of rows of resistors is 2*N+1, where N is an even number, and further comprising selecting the physical center row to be in the center of the electrical order of rows of resistive elements.

26. The method of claim 22 wherein the total number of rows of resistors is 2*N+1, where N is an odd number, and further comprising selecting the physical center row to be in the center of the electrical order of rows of resistive elements.

27. The method of claim 22 wherein electrically connecting comprises connecting the pairs of rows together so that conduction across the array in one row of each of the pairs of rows is in the opposite direction from the conduction across the array in the other row of each respective pair of rows.

28. The method of claim 27 further comprised of:
providing a plurality of node select transistors, each having a control terminal controlling the conduction through the node select transistor between first and second transistor terminals;
coupling the first terminal of each node select transistor to a respective node in an array of resistive elements;
coupling the control terminal of the node select transistors in each column to a respective column select line; and,
coupling the second terminal of each node select transistor in each row of the array to a respective row line.

29. The method of claim 28 further comprised of coupling a row select transistor to each row line.

30. The method of claim 27 wherein the substrate is a silicon substrate.

31. The method of claim 22 wherein the resistors are ohmic resistors.

32. A method of reducing the effect of resistance gradients and switching perturbations in an array of serially connected resistive elements on a substrate comprising:

arranging the plurality of resistive elements in an array of columns and rows, the array having a physical middle defined by a plurality of rows above and an equal plurality of rows below the physical middle of the array; and, electrically connecting together each pair of rows comprising a row above and a row equally spaced below the physical middle of the array without electrically connecting another row of resistive elements there between, and connecting the pairs of rows so t hat conduction a cross the array in one row is in the opposite direction from the conduction across the array in the other row of each respective pair of rows;

providing a plurality of node select transistors, each having a control terminal controlling the conduction through the respective node select transistor between first and second transistor terminals;

coupling the first terminal of each node select transistor to a respective node in the array of resistive elements;

coupling the control terminal of the node select transistors in each column a respective column select line; and, coupling the second terminal of each node select transistor in each row of the array to a respective row line.

33. The method of claim 32 further comprised of providing a row select transistor coupled to each row line.

34. The method of claim 32 wherein the substrate is a silicon substrate.

35. The method of claim 32 wherein the resistors are ohmic resistors.

36. The method of claim 32 further comprised of selecting the electrical order to place physically adjacent rows at positions equally spaced from the center of the electrical order of rows.

37. The method of claim 36 wherein the total number of rows of resistors is 2*N, where N is an even number.

38. The method of claim 36 wherein the total number of rows of resistors is 2*N, where N is an odd number, and wherein the physical center pair of rows is in the center of the electrical order of rows.

39. The method of claim 36 wherein the total number of rows of resistors is 2*N+1, where N is an even number, and wherein the physical center row is in the center of the electrical order of rows.

40. The method of claim 36 wherein the total number of rows of resistors is 2*N+1, where N is an odd number, and wherein the physical center row is in the center of the electrical order of rows.

* * * * *